United States Patent [19]
Martin et al.

[11] 4,116,000
[45] Sep. 26, 1978

[54] ENGINE CONTROL SYSTEM

[75] Inventors: Anthony Newman Martin, Simsbury; Carl James Buczek, Manchester, both of Conn.; Robert Joseph Mongeon, East Longmeadow, Mass.

[73] Assignee: United Technologies Corporation, Hartford, Conn.

[21] Appl. No.: 737,379

[22] Filed: Nov. 1, 1976

[51] Int. Cl.$^2$ ............................................. F02K 1/18
[52] U.S. Cl. .................... 60/242; 60/226 R; 60/39.29; 340/380; 350/96.24; 60/39.25
[58] Field of Search ............. 60/242, 39.28 R, 39.29; 340/380, 336 R; 350/96 R, 96 B

[56] References Cited
U.S. PATENT DOCUMENTS

| | | | |
|---|---|---|---|
| 2,806,402 | 9/1957 | Ferris | 340/380 UX |
| 3,237,012 | 2/1966 | Treffeisen | 350/96 R |
| 3,384,885 | 5/1968 | Forbush | 340/380 X |
| 3,566,140 | 2/1971 | Grangvist | 350/96 R |
| 3,717,171 | 2/1973 | Fawkes | 350/96 R |
| 3,953,730 | 4/1976 | Henry | 350/96 B |

*Primary Examiner*—Clarence R. Gordon
*Attorney, Agent, or Firm*—Robert C. Walker

[57] ABSTRACT

Apparatus for controlling the position of a parameter setting device of a gas turbine engine is disclosed. Techniques for improving the accuracy of the control system by incorporating an optical circuit for sensing physical parameters, such as linear position, pressure and temperature are developed. A fiber optic cable linking a remote intelligence processing unit with a sensing unit at the controlled device is employed in the preferred embodiment.

2 Claims, 2 Drawing Figures

ENGINE CONTROL SYSTEM

BACKGROUND OF THE INVENTION

1. Field of the Invention

This invention relates to gas turbine engines and more particularly to the control of parameter setting devices for the engine.

2. Description of the Prior Art

Modern gas turbine engines have come to rely on sophisticated parameter variations throughout the engine operating cycle to optimize engine efficiency and stability over a wide range of power levels. The most commonly varied parameters include fuel flow, flowpath contour, and pressure along the flowpath. Numerous mechanical, pneumatic, electrical, hydraulic and electromechanical devices have been developed to meet the perceived operational and environmental requirements in variance of the parameters.

The accuracy of all prior developed parameter controlling devices is, of course, limited to the accuracy of sensing equipment within the control circuit for sensing physical intelligence such as the current position of the parameter controlling device. Engine designers and manufacturers have devoted substantial economic and valued personnel resources toward the development of improved sensing apparatus which can be made compatible with the hostile engine environment in which the sensing and control apparatus must operate. The concepts of the present invention are directed to further improved apparatus.

SUMMARY OF THE INVENTION

A primary aim of the present invention is to provide an improved control system for a gas turbine engine. Reductions in the cost, weight and complexity of the control system are concurrent goals. A reduction in the adverse effects of hostile thermal and vibratory environments on the control system is sought and, in one aspect of the invention, a specific object is to reduce the sensitivity of the control system to electromagnetic interference.

In accordance with the present invention, the intelligence processing unit of the system is positioned on an engine remotely from harsh thermal environments and is communicatively joined to a sensing unit at the device to be controlled by a multiway fiber optic cable which is adapted to conduct a light source to the sensing unit and to return a multibit, encoded parameter signal to the intelligence processing unit.

A primary feature of the present invention is the intelligence processing unit which is positioned remotely from the most hostile engine thermal environments. A sensing unit, which in the preferred embodiment senses linear position, is located in proximity to the controlled device. A fiber optic cable links the intelligence processing unit with the position sensing unit. The fiber optic cable is adapted to conduct a light signal to the position sensing unit and to return a multibit encoded, position signal from the sensing unit.

A principal advantage of the present invention is the elimination of mechanical or electrical, sensing linkages between the intelligence processing unit and the controlled device. A reduction in the adverse effects of electromagnetic interference on the control system is enabled by transmitting parameter intelligence through fiber optic ways in lieu of electric cables. Improved control reliability and accuracy are made possible by positioning the intelligence processing unit in an engine region having only limited exposure to the hostile thermal influences. The apparatus comprising the present invention is readily adaptable to closed-loop control systems. Elastomeric shock mounting of the intelligence processing unit is further employable at the reduced temperature, engine location to mitigate the effects of adverse vibratory stimuli on the control system.

The foregoing, and other objects, features and advantages of the present invention will become more apparent in the light of the following detailed description of the preferred embodiment thereof as shown in the accompanying drawing.

DESCRIPTION OF THE PREFERRED EMBODIMENT

Figure 1:
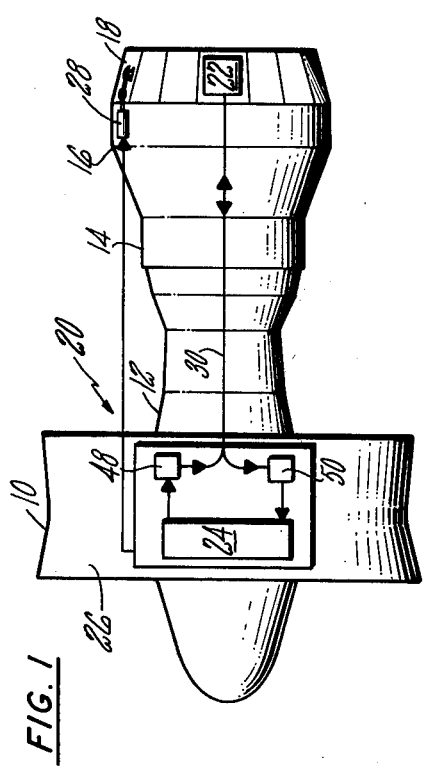
FIG. 1 is a simplified side elevation view of a gas turbine engine including exhaust nozzle control apparatus illustrated in block form.

A simplified side elevation view of a gas turbine engine is shown in FIG. 1. The engine principally comprises a fan section 10, a compression section 12, a combustion section 14, a turbine section 16 and an exhaust nozzle 18. Efficient operation of the engine requires accurate control of various parameter setting devices about the engine. Such devices include but are not limited to variable exhaust nozzles for controlling the engine flowpath discharge aperture, actuators for setting the angle of attach of rotatable stator vanes, and flowpath bleed ports for controlling the amount of air bled from the flowpath of a gas turbine engine during operation. The control of such devices is described in detail in this specification with respect to the engine exhaust nozzle although the concepts and the systems as described and claimed are equally applicable to other controlled devices, including those positionable in response to temperature and pressure parameters.

A system 20 for controlling the aperture area of the exhaust nozzle is illustrated in simplified block form. The system includes a position sensing unit 22 mounted in proximity to the exhaust nozzle; an intelligence processing unit 24 mounted at an environmentally benign engine location such as the fan case 26; and an actuator 28 which is mechanically linked to the exhaust nozzle. The position sensing unit and the intelligence processing unit are communicatively joined by a fiber optic cable 30 which is adapted for the two-way transmission of light energy between the connected units. The processing unit and the actuator are joined by various electrical, mechanical or electromechanical devices, the precise nature of which is not essential to the present invention.

Figure 2:
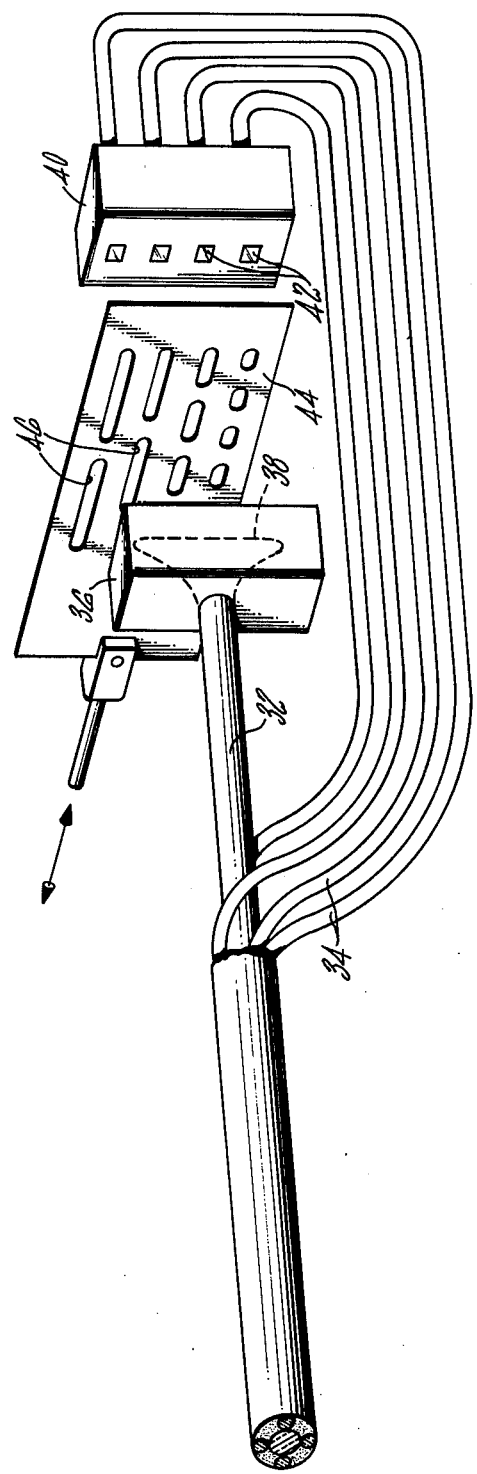
FIG. 2 is a pictoral representation of an optical position sensing unit constructed in accordance with the present invention.

The essential element of the preferred embodiment system 20 is the optic, position sensing apparatus which includes the position sensing unit 22 and the fiber optic cable 30. One typical sensing unit and cable are pictorally represented in FIG. 2. The cable has a large central way 32 and a plurality of smaller ways 34. The sensing unit has a sending block 36 including a contoured passage 38 formed therein, and a receiving block 40 including a plurality of discrete holes 42 formed therein. The holes of the receiving block are aligned with the smaller ways of the fiber optic cable and the contoured passage of the sending block is aligned with the large central way. An optical mask 44, which is positionally variable with respect to the sending and receiving blocks, is disposed between the blocks. The mask has a multiplicity of apertures 46 disposed in calculated array so as to encode a position signal based upon the relative position of the mask apertures and the receiving block holes. The optical mask 44, in one embodiment, is mechanically linked to the controlled device. In another embodiment, the sending and receiving blocks are linked to the controlled device and the mask remains stationary.

During operation of the engine, light energy is transmitted from an optical transmitter 48 at the intelligence processing unit 24 via the large way 32 of the fiber optic cable to the passage 38 of the sending block. The optical mask 44 intercepts a portion of the light energy emanating from the passage but allows the remainder to pass through the aligned mask apertures 46 to the corresponding holes 42 of the receiving block. The light energy at the receiving block represents a coded signal indicating the position of the optical mask and, hence, the controlled device.

The encoded signal is a digital on-off pattern formed of multibits of light energy. In the embodiment shown the signal comprises four discrete bits of on-off intelligence. Each discrete bit of intelligence is transmitted from the receiving block of the position sensing unit through a corresponding smaller way 34 to an optical receiver 50 at the intelligence processing unit 24. A higher degree of position accuracy is obtainable with systems having more discrete bits of on-off intelligence. For example, a system having eight bits of encoded on-off intelligence is theoretically accurate within one-quarter of 1 percent (0.25%). As adapted to the exhaust nozzle of one specific engine, the system includes nine of the smaller ways 34 and nine receiving block apertures 42 for carrying nine discrete bits of intelligence.

The digital on-off pattern produced by the sensing unit is highly compatible with the intelligence processing units of modern control systems, including those employing electronic or optical circuitry. The conversion of analog parameter intelligence, as sensed by the prior used systems, is not required.

The intelligence processing unit 24 relates the device position signal to the optimum position at the engine operating condition desired and causes the actuator 28 to reposition the controlled device by conventional means until the actual position and the desired position are in substantial conformance.

The system 20 functions as a closed loop thereby permitting definitive control of the engine parameters even under transient operating conditions. The utilization of a closed-loop control will be recognized by those skilled in the art to offer substantial advantages. As a new device setting is selected by the operator, the engine continues to respond to the actual device setting as sensed by the present apparatus. The integration of actual position intelligence from all controlled devices at the intelligence processing unit enables smooth operating transitions.

As is viewable in FIG. 1, the intelligence processing unit is mounted on the fan case remotely from the combustion and turbine sections of the engine. The unit may alternatively be mounted at the compression section 12. A relatively cool engine location is selected to avoid adverse thermal influence on the unit. A cool location is especially desirable where electronic components are utilized in the intelligence processing unit.

The relatively cool location similarly is compatible with elastomeric shock mounting systems for the intelligence processing unit. Shock mounting decreases the sensitivity of the unit to vibratory stimuli which may adversely effect the accuracy of the unit.

The use of the optical position sensing circuit is especially critical to the control system. The system can be no more accurate than the position signal received at the intelligence processing unit. Interference with the transmitted position signal, such as that experienced by electric cable systems responding to electromagnetic interferences, is avoided.

Although the invention has been shown and described with respect to preferred embodiments thereof, it should be understood by those skilled in the art that various changes and omissions in the form and detail thereof may be made therein without departing from the spirit and the scope of the invention.

Having thus described typical embodiments of our invention, that which we claim as new and desire to secure by Letters Patent of the United States is:

1. Apparatus for controlling the aperture of a variable area exhaust nozzle of a gas turbine engine, comprising:
   an intelligence processing unit positioned remotely from the exhaust nozzle;
   a sensing unit located in proximity to the exhaust nozzle and which has incorporated therein a signal encoder operative in response to an optical signal initiated at said intelligence processing unit for sensing the position of the exhaust nozzle;
   means for transmitting the initiated optical signal from the intelligence processing unit to the position sensing unit and returning the encoded position signal to the intelligence processing unit; and
   actuator means, which is mechanically coupled to the exhaust nozzle and which is responsive to a signal initiated at said intelligence processing unit for setting the aperture area of said exhaust nozzle.

2. The invention according to claim 1 wherein said means for transmitting the initiated optical signal from the intelligence processing unit to the position sensing unit and returning the encoded signal to the intelligence processing unit includes:
   a first fiber optic light way for transmitting the initiated signal to the position sensing unit; and
   a plurality of second fiber optic light ways for transmitting the encoded signal from the position sensing unit to the intelligence processing unit.

* * * * *